US009030881B2

(12) United States Patent
Tokuhira et al.

(10) Patent No.: US 9,030,881 B2
(45) Date of Patent: May 12, 2015

(54) NONVOLATILE SEMICONDUCTOR MEMORY DEVICE

(71) Applicant: Kabushiki Kaisha Toshiba, Minato-ku, Tokyo (JP)

(72) Inventors: Hiroki Tokuhira, Yokohama (JP); Tsukasa Nakai, Hino (JP); Hiroyoshi Tanimoto, Yokohama (JP); Masaki Kondo, Kawasaki (JP); Toshiyuki Enda, Zushi (JP); Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 13/962,898

(22) Filed: Aug. 8, 2013

(65) Prior Publication Data
US 2014/0254276 A1  Sep. 11, 2014

(30) Foreign Application Priority Data
Mar. 8, 2013 (JP) ................................. 2013-046983

(51) Int. Cl.
*G11C 16/04* (2006.01)
(52) U.S. Cl.
CPC .................................. *G11C 16/0466* (2013.01)
(58) Field of Classification Search
CPC ..... G11C 16/0483; G11C 16/10; G11C 11/22
USPC .................................. 365/185.17, 185.03, 145
See application file for complete search history.

(56) References Cited

U.S. PATENT DOCUMENTS

| | | | |
|---|---|---|---|
| 5,986,939 A * | 11/1999 | Yamada | 365/185.29 |
| 7,968,406 B2 | 6/2011 | Ramaswamy et al. | |
| 8,076,714 B2 | 12/2011 | Forbes | |
| 8,183,110 B2 | 5/2012 | Ramaswamy et al. | |
| 2003/0085375 A1 * | 5/2003 | Schubring et al. | 252/62.51 R |
| 2007/0117303 A1 * | 5/2007 | Komori et al. | 438/213 |
| 2007/0132003 A1 | 6/2007 | Takashima et al. | |
| 2009/0244969 A1 | 10/2009 | Maejima | |
| 2009/0267134 A1 | 10/2009 | Koike et al. | |
| 2011/0098173 A1 * | 4/2011 | Fujii et al. | 501/134 |

FOREIGN PATENT DOCUMENTS

| | | |
|---|---|---|
| JP | 2004-023044 A | 1/2004 |
| JP | 2005-276428 A | 10/2005 |

OTHER PUBLICATIONS

G. Molas et al: "Thorough investigation of Si-nanocrystal memories with high-k interpoly dielectrics for sub-45nm node Flash NAND applications", IEDM, 2007, pp. 453-456 (in English).

(Continued)

*Primary Examiner* — Huan Hoang
(74) *Attorney, Agent, or Firm* — Holtz, Holtz, Goodman & Chick PC

(57) ABSTRACT

According to one embodiment, a nonvolatile semiconductor memory device comprises memory cells each which stores data with two or more levels. Each of the memory cells includes a semiconductor layer, a first insulating layer on the semiconductor layer, a charge storage layer on the first insulating layer, a second insulating layer on the charge storage layer, and a control gate electrode on the second insulating layer, and the second insulating layer includes a ferroelectric layer.

19 Claims, 16 Drawing Sheets

(56) References Cited

OTHER PUBLICATIONS

T. S. Boscke et al.: "Ferroelectricity in Hafinium Oxide: CMOS compatible Ferroelectric Field Effect Transistors", Electron Devices Meeting (IEDM), 2011 IEEE International, Dec. 2011, pp. 24.5.1-24.5.4 (in English).

J. Muller et al.: "Ferroelectricity in $HfO_2$ enables nonvolatile data storage in 28nm HKMG", 2012 Symposium on VLSI Technology Digest of Technical Papers, Jun. 2012, pp. 25 & 26 (in English).

* cited by examiner

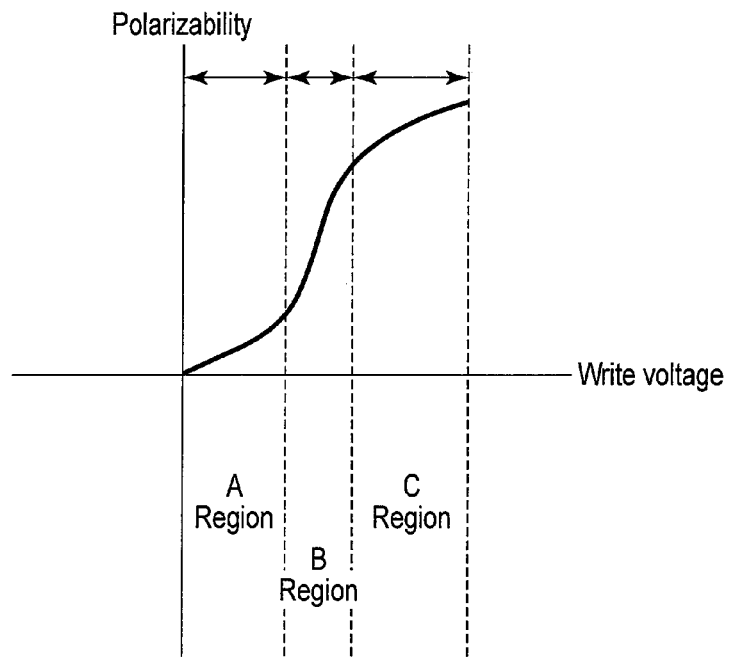
F I G. 3
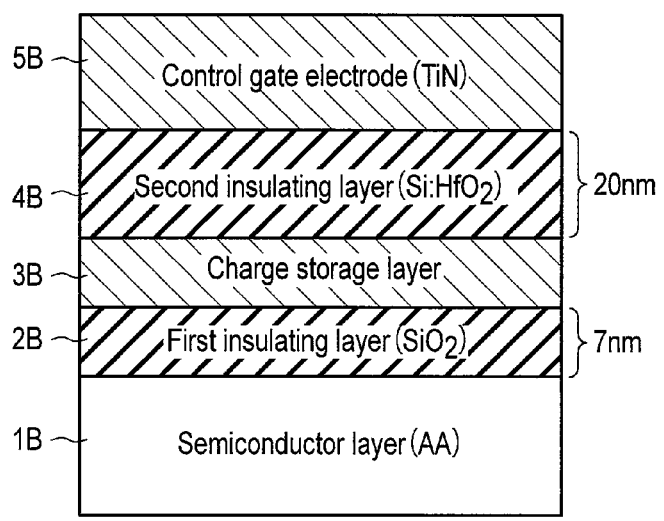
F I G. 5

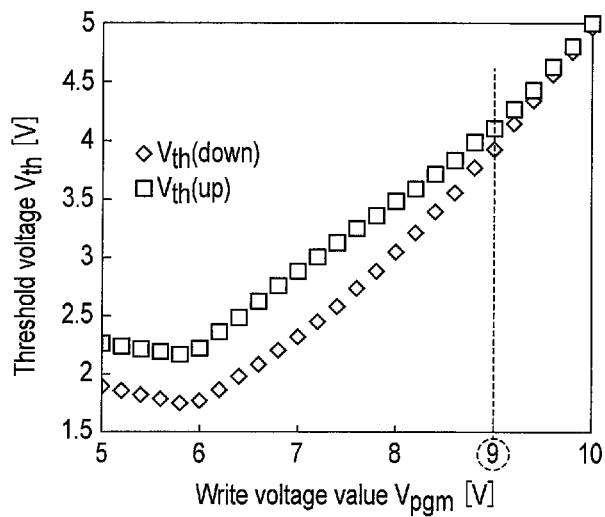
F I G. 6
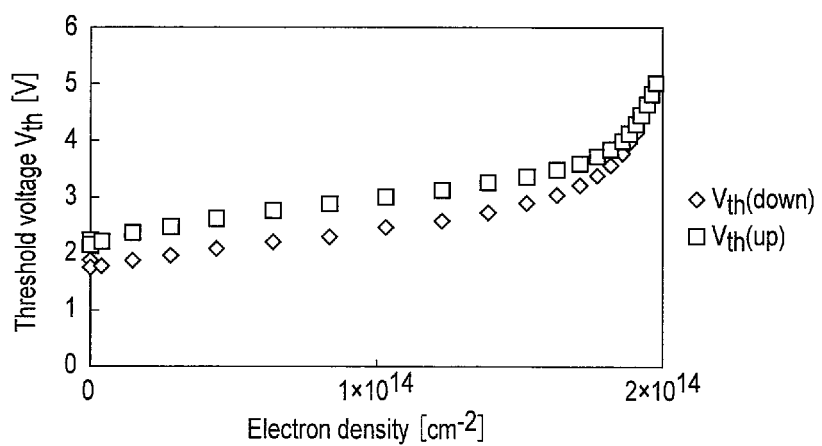
F I G. 7

| No. | First insulating layer | Second insulating layer | Region of preferable threshold voltage $V_{th}$ [V] | Retention charge density [μC/cm²] | Write voltage value $V_{pgm}$ [V] | Insulating layer voltage at time of retention [V] |
|---|---|---|---|---|---|---|
| 1 | SiO₂ 7 [nm] | Si:HfO₂ 20 [nm] | 0~3.5 | -20~20 | 7~11.5 | 0~2 |
| 2 | SiO₂ 7 [nm] | Si:HfO₂ 10 [nm] | 0~1.5 | -20~20 | 7~9 | 0~1 |
| 3 | SiO₂ 5 [nm] | Si:HfO₂ 20 [nm] | 0~2.5 | -20~20 | 5.5~9 | 0~2 |
| 4 | Al₂O₃ 6 [nm] | SBT 50 [nm] | 2~2.8 | -12~6 | 5.5~6.5 | -0.2~0.2 |

F I G. 11

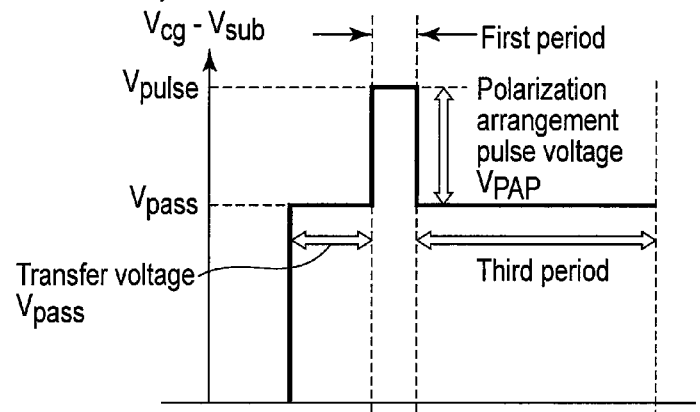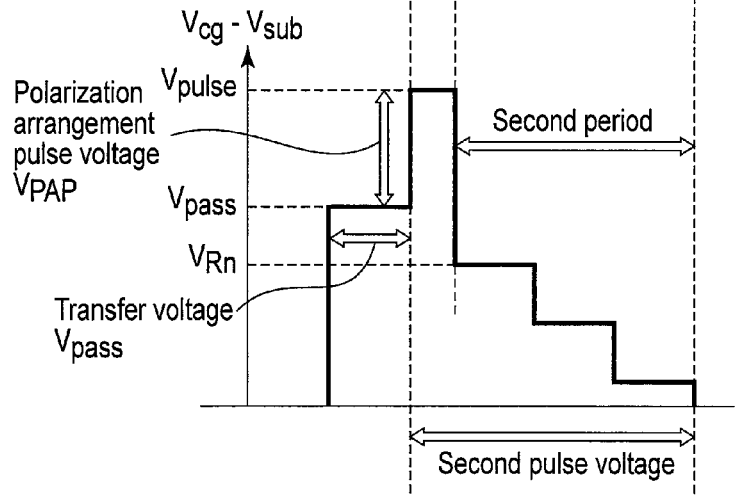
FIG. 16

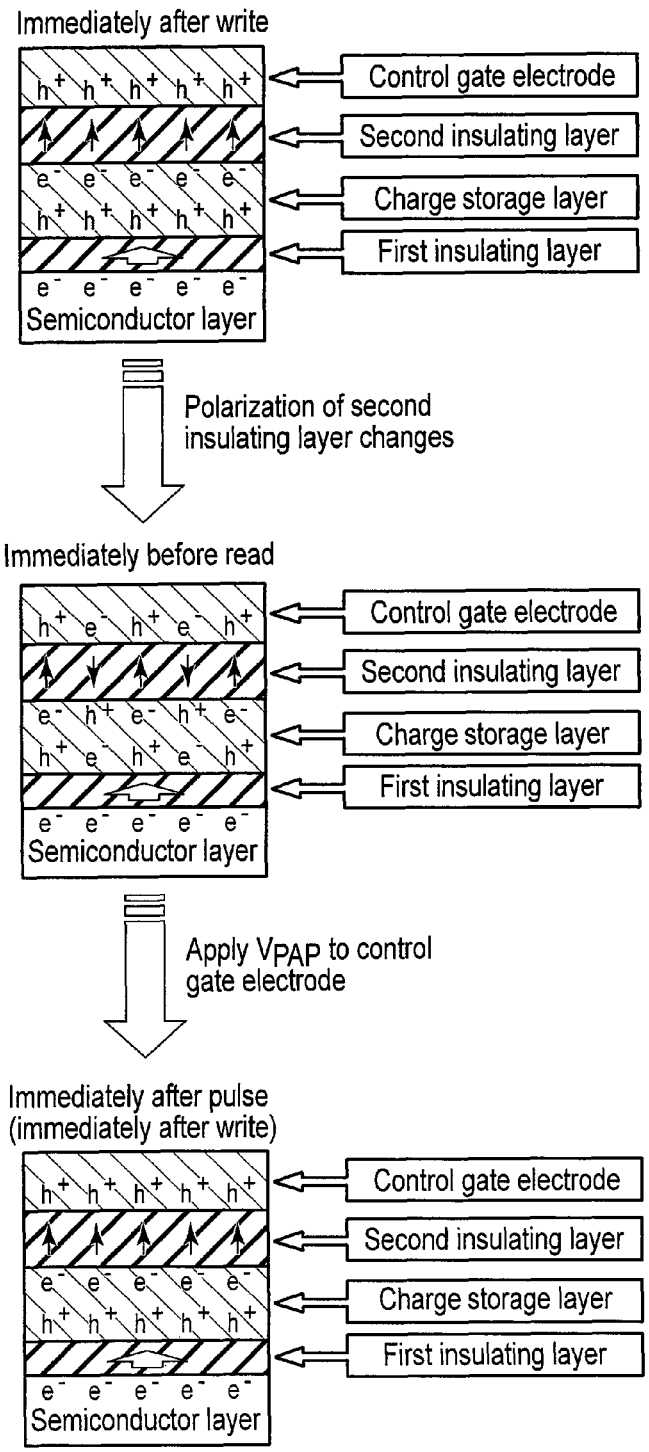
F I G. 17

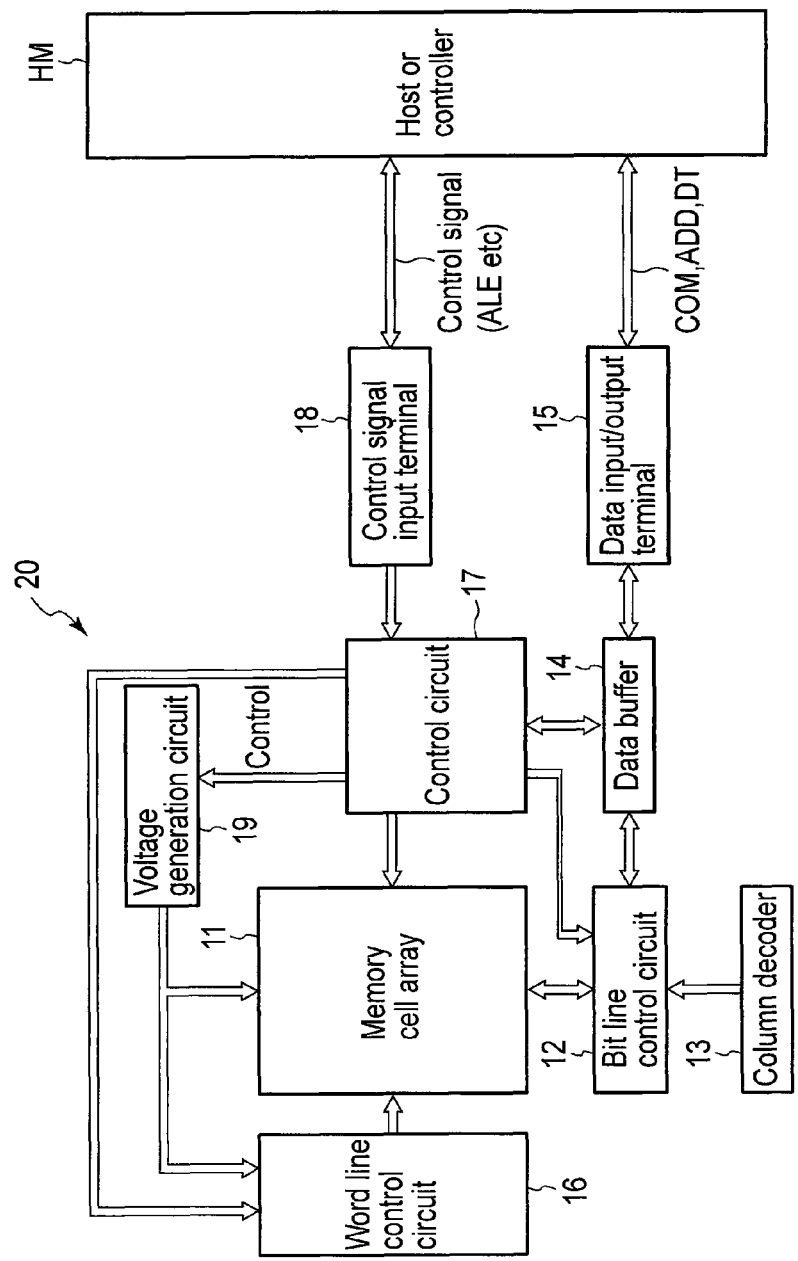
F I G. 19

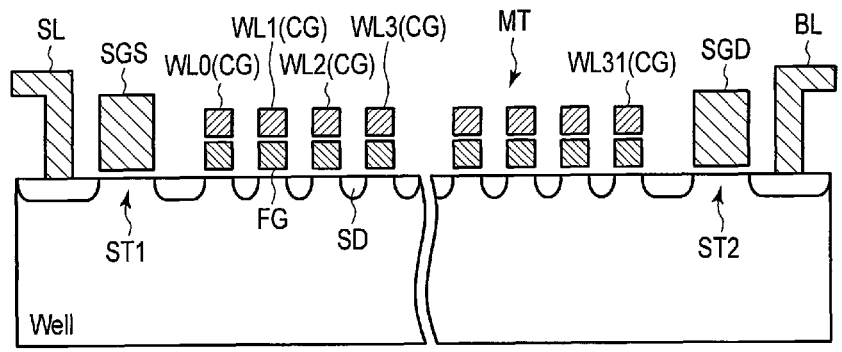
F I G. 21
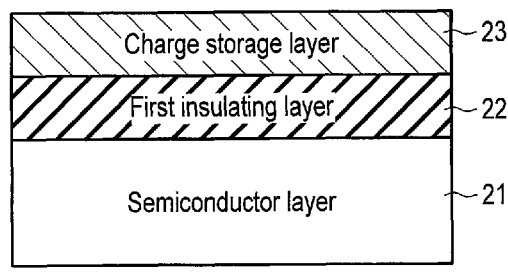
F I G. 22
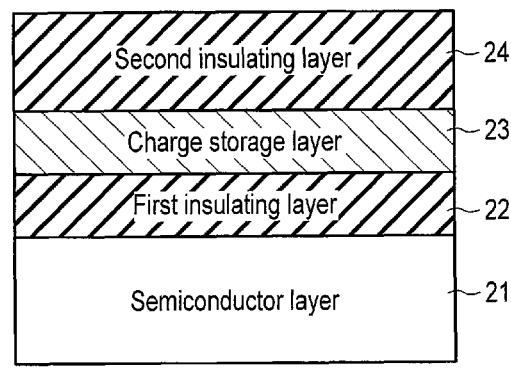
F I G. 23

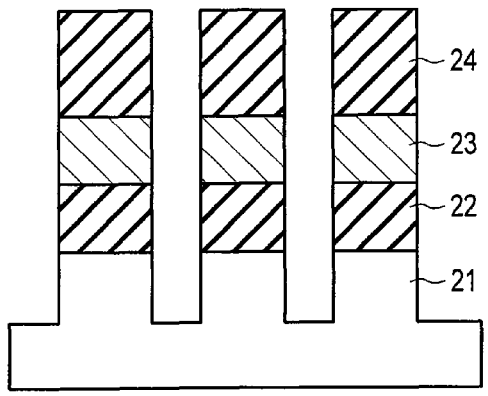
F I G. 2 4
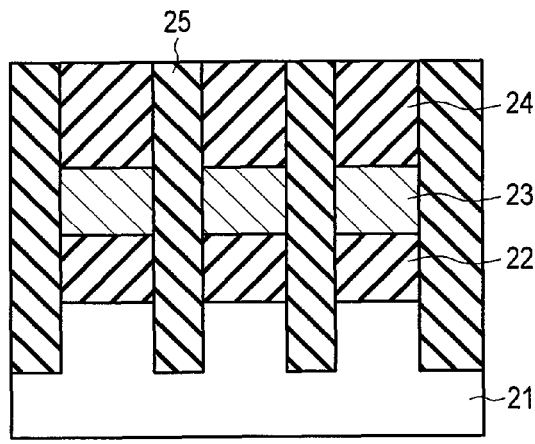
F I G. 2 5
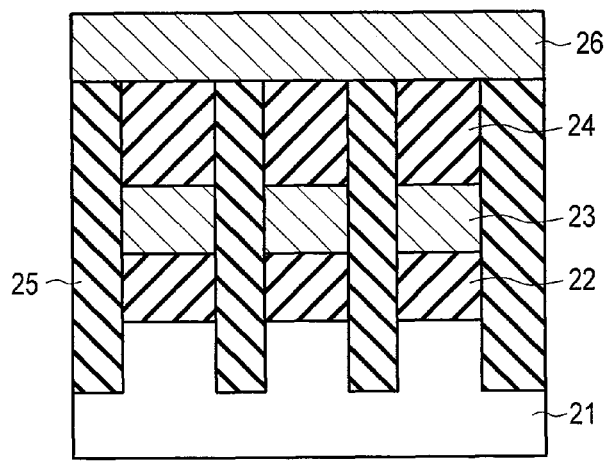
F I G. 2 6

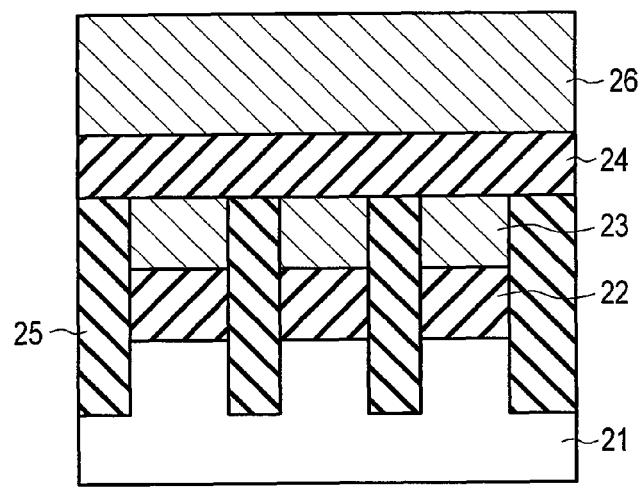
F I G. 27
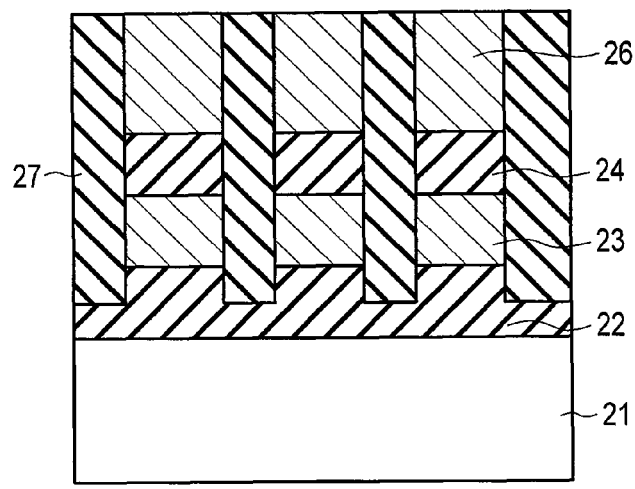
F I G. 28

NONVOLATILE SEMICONDUCTOR MEMORY DEVICE

CROSS-REFERENCE TO RELATED APPLICATIONS

This application is based upon and claims the benefit of priority from Japanese Patent Application No. 2013-046983, filed Mar. 8, 2013, the entire contents of which are incorporated herein by reference.

FIELD

Embodiments described herein relate generally to a nonvolatile semiconductor memory device.

BACKGROUND

For nonvolatile semiconductor memory devices, microfabrication of memory cells is being pushed forward to increase the storage capacity. However, the memory cell characteristic problematically degrades along with the microfabrication of the memory cells. In, for example, a flash memory, the leakage current from an insulating layer in contact with a charge storage layer needs to be sufficiently small. This poses a limitation to thinning of a first insulating layer between a semiconductor layer and the charge storage layer and a second insulating layer between the charge storage layer and a control gate electrode. In addition, when the memory cells become finer, the capacitance (inter-cell interference) between adjacent memory cells cannot be neglected. For the purpose of reducing the inter-cell interference and increasing the coupling ratio, a structure in which a control gate electrode covers the side surface of a charge storage layer or a structure in which a second insulating layer uses a High-k material having a dielectric constant higher than that of $SiO_2$ is used. However, both structures do not suffice for suppressing the degradation of the memory cell characteristic caused by microfabrication of memory cells.

BRIEF DESCRIPTION OF THE DRAWINGS

FIG. 3 is a graph showing the polarizability of a second insulating layer with respect to a write voltage value according to the embodiment;

FIG. 5 is a sectional view showing a structure example according to the first embodiment;

FIG. 6 is a graph showing a change in $V_{th}$ with respect to $V_{pgm}$ according to the first embodiment;

FIG. 7 is a graph showing the relationship between the electron density in a charge storage layer and threshold voltage $V_{th}$ according to the first embodiment;

FIG. 11 is a table, showing various characteristics when the film thicknesses and materials of first and second insulating layers are changed, according to the first embodiment;

FIG. 16 is a timing chart showing a read method for selected and unselected memory cells according to the embodiment;

FIG. 17 is a conceptual view showing the effect of $V_{PAP}$ according to the embodiment;

FIG. 19 is a block diagram showing a NAND flash memory as an application example of the each embodiment;

FIG. 21 is a sectional view of a NAND string structure as an application example of the each embodiment; and FIGS. 22, 23, 24, 25, 26, 27, and 28 are sectional views showing the manufacturing method of a memory cell according to the embodiment.

DETAILED DESCRIPTION

In general, according to one embodiment, a nonvolatile semiconductor memory device comprises memory cells each which stores data with two or more levels.

Each of the memory cells includes a semiconductor layer, a first insulating layer on the semiconductor layer, a charge storage layer on the first insulating layer, a second insulating layer on the charge storage layer, and a control gate electrode on the second insulating layer, and the second insulating layer includes a ferroelectric layer.

The embodiments of the present invention will now be described with reference to the accompanying drawings.

[Basic Concept]

The embodiment is associated with a nonvolatile memory cell including a charge storage layer and a control gate electrode.

The nonvolatile memory cell according to the embodiment has characteristic features in the memory cell structure and the write/erase/read method.

As the characteristic feature of the memory cell structure, a second insulating layer formed between a charge storage layer and a control gate electrode includes a ferroelectric layer. The charge storage layer is made of a metal or polysilicon.

Figure 1:
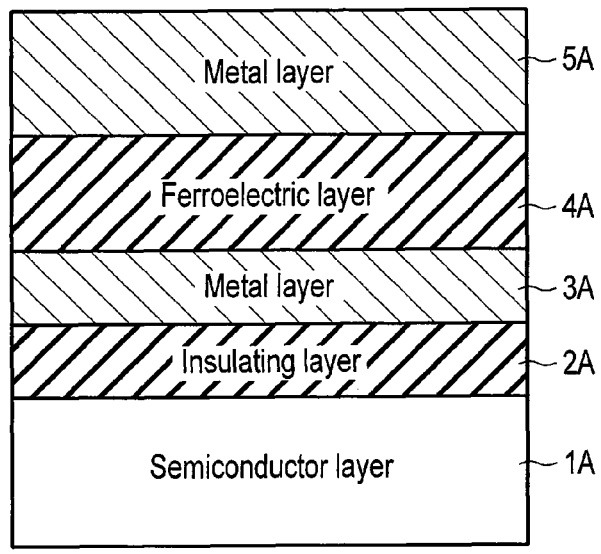
FIG. 1 is a sectional view of an MFMIS structure.

In general, there exists a FeRAM having an MFMIS structure as a nonvolatile memory cell including a ferroelectric layer. The FeRAM having the MFMIS structure has a stacked structure including semiconductor layer 1A, insulating layer (for example, $SiO_2$) 2A on semiconductor layer 1A, metal layer 3A on insulating layer 2A, ferroelectric layer 4A on metal layer 3A, and metal layer 5A on ferroelectric layer 4A, as shown in FIG. 1. The FeRAM retains data by the hysteresis of the ferroelectric layer. Hence, in principle, insulating layer 2A and metal layer 3A on insulating layer 2A may be absent.

However, when ferroelectric layer 4A cannot directly be formed on semiconductor layer 1A, ferroelectric layer 4A is crystal-grown after formation of insulating layer 2A and metal layer 3A. Insulating layer 2A is preferably as thin as possible and may have a thickness less than, for example, 5 nm.

However, the memory cell according to the embodiment performs the write, retaining, and read operations by the same principle as that of a NAND flash memory, unlike the ferroelectric layer memory cell as shown in FIG. 1. That is, charges are stored from the semiconductor layer in the charge storage layer through the first insulating layer by the tunnel effect. Data is retained by the amount of charges stored in the charge storage layer. To prevent the charges stored in the charge storage layer from leaking through the first insulating layer, the thickness of the first insulating layer needs to be 5 nm or more.

As for the write/erase method, the charge amount in the charge storage layer is controlled using polarization of the ferroelectric layer upon applying a write/erase voltage to the memory cell according to the embodiment.

For example, at the time of write, when positive write voltage $V_{pgm}$ is applied to the control gate electrode, the polarization in the ferroelectric layer is directed upward. This makes it possible to inject more electrons into the charge storage layer. Additionally, for example, at the time of erase, when positive erase voltage $V_{era}$ is applied to the semiconductor layer, the polarization in the ferroelectric layer is directed downward. This makes it possible to remove more electrons from the charge storage layer. That is, the ferroelectric layer in the second insulating layer assists charge injection/removal to/from the charge storage layer.

On the other hand, after the write/erase, the polarization of the ferroelectric layer in the second insulating layer, which is uniformly directed upward or downward, changes to a state in which upward polarization and downward polarization coexist along with the elapse of time due to disturbance or a depolarization effect of setting a stable state in terms of energy. If the read operation is performed in this state, accurate read cannot be performed.

To prevent this, a polarization arrangement pulse voltage is applied to the memory cell according to the embodiment before read in order to uniformly arrange the polarization in random directions of the ferroelectric layer in the second insulating layer. The polarization arrangement pulse voltage uniformly arranges the polarization in the ferroelectric layer upward or downward and needs to meet a condition that charge injection/removal (write/erase) for the charge storage layer does not occur. The waveform of the polarization arrangement pulse voltage is determined based on this condition.

Note that the simple term "read" includes not only normal read but also verify read after write/erase, which is performed to verify whether the write/erase has correctly be done.

Embodiment

Figure 2:
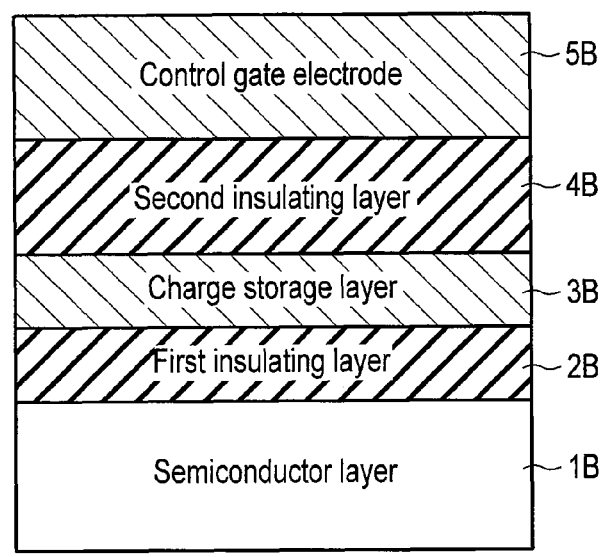
FIG. 2 is a sectional view of a nonvolatile memory cell according to an embodiment.

FIG. 2 illustrates the sectional structure of a nonvolatile memory cell according to the embodiment.

The nonvolatile memory cell according to the embodiment has a stacked structure in which first insulating layer 2B is formed on semiconductor layer 1B, charge storage layer 3B is formed on first insulating layer 2B, second insulating layer 4B including a ferroelectric layer is formed on charge storage layer 3B, and control gate electrode 5B is formed on second insulating layer 4B.

The following effects are obtained using a ferroelectric layer in second insulating layer 4B.

At the time of write, the leakage current from second insulating layer 4B can be reduced.

Write and erase can be done using a low voltage.

Since the electron density is high, the 1 electron sensitivity is low, and the memory cell is suitable for microfabrication.

In spite of the high coupling ratio and the low write voltage value, the electric field of first insulating layer 2B can easily be controlled at the time of write due to the nonlinearity of the dielectric constant.

When saving data written in the nonvolatile memory cell for a long time, the polarization stabilizes due to the depolarization effect of the ferroelectric layer so that the electric fields in the first and second insulating layers (2B and 4B) are minimized. This makes it difficult to remove the charges from charge storage layer 3B and consequently improves the charge retention characteristic of the nonvolatile memory cell.

FIG. 3 is a graph showing the polarizability of second insulating layer 4B with respect to a write voltage value according to the embodiment.

The change in the polarizability of second insulating layer 4B with respect to the write voltage value is divided into three regions A to C.

The slope of the polarizability to the write voltage value is proportional to the magnitude of the dielectric constant. That is, the larger the slope of the polarizability is, the larger the dielectric constant is.

The slope of the polarizability shown in FIG. 3 is maximum in region B. Hence, the dielectric constant is maximum in region B.

As described above, the dielectric constant of second insulating layer 4B exhibits a different value in accordance with the write voltage value. In addition, the polarization of second insulating layer 4B decreases the potential difference in second insulating layer 4B.

Generally, the polarizability of a dielectric linearly changes with respect to a voltage. In the embodiment, however, since the ferroelectric layer is used, the polarizability changes nonlinearly. However, the change differs depending on the material of the ferroelectric layer.

Figure 4:
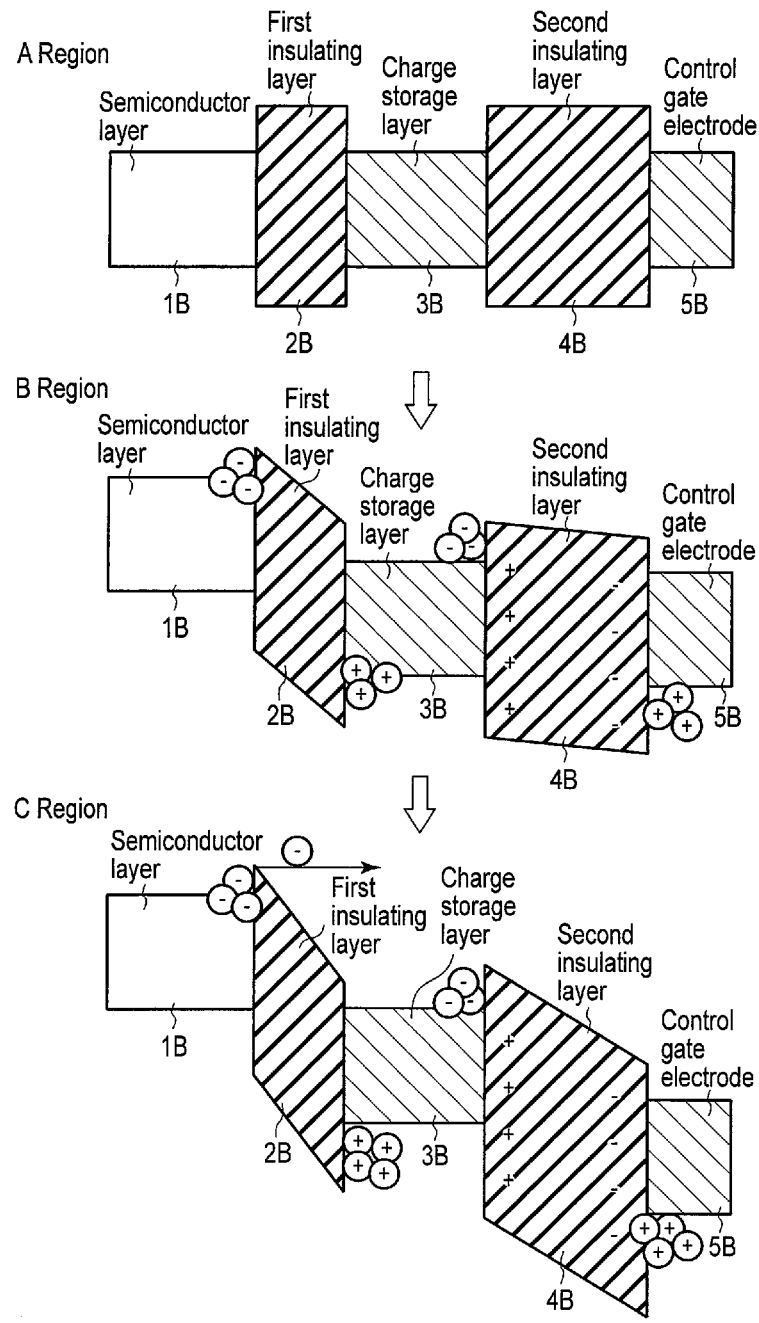
FIG. 4 is a view showing energy bands, corresponding to regions A to C in FIG. 3, according to the embodiment.

FIG. 4 is a view showing energy bands, corresponding to regions A to C in FIG. 3, according to the embodiment.

As is apparent from FIGS. 3 and 4, the write voltage value is small in region A. For this reason, the bands of the first and second insulating layers (2B and 4B) do not change.

The write voltage value in region B is larger than in region A. For this reason, the band of first insulating layer 2B largely tilts. The polarizability in second insulating layer 4B steeply changes with respect to the write voltage value. This indicates that the dielectric constant of second insulating layer 4B is very large in region B. Hence, charges injected into charge storage layer 3B through first insulating layer 2B are attracted by second insulating layer 4B having a high dielectric constant and stored in charge storage layer 3B at a high density. At this time, the memory cell is in the initial write state.

However, the change in the polarizability of second insulating layer 4B when the write voltage value is applied differs depending on the material of the ferroelectric layer used in second insulating layer 4B.

The write voltage value in region C is larger than in region B. For this reason, the potential of first insulating layer 2B can finely be controlled in a wide range. This indicates that multi-level data, that is, at least binary data can be written in the memory cell. The band of second insulating layer 4B largely tilts relative to first insulating layer 2B. In addition, the change in the polarizability of second insulating layer 4B with respect to the write voltage value is smaller than in region B. Hence, the dielectric constant of second insulating layer 4B in region C is smaller than in region B.

Generally, the tilt of the band of second insulating layer 4B with respect to the tilt of the band of first insulating layer 2B changes at a predetermined ratio. In the embodiment, however, since the ferroelectric layer is used in second insulating layer 4B, the tilt of the band of second insulating layer 4B with respect to the tilt of the band of first insulating layer 2B changes at different ratios.

Detailed embodiments will be described below.

First Embodiment

FIG. 5 is a sectional view showing a structure example according to the first embodiment.

The first embodiment shown in FIG. 5 is the same as the structure of the embodiment shown in FIG. 2 except the materials, film thicknesses, and memory cell size.

First insulating layer 2B is an oxide film made of $SiO_2$ and having a film thickness of about 7 nm. The film thickness of first insulating layer 2B is preferably designed within the range of 5 nm (inclusive) to 10 nm (inclusive). The film thickness in this range prevents the charges stored in charge storage layer 3B from leaking through first insulating layer 2B and also enables microfabrication.

Second insulating layer 4B is a ferroelectric layer made of $HfO_2$ doped with Si ($Si:HfO_2$) and having a film thickness of 20 nm. The Si concentration of second insulating layer 4B is 4 mol %. Control gate electrode 5B contains TiN. AA in semiconductor layer 1B indicates an active area.

The memory cell size is 24 nm×24 nm.

The dose is adjusted such that the voltage of first insulating layer 2B becomes threshold voltage $V_{th}$ at 1.5 V, and write is performed at 7 V (10 MV/cm).

FIG. 6 is a graph showing the relationship between write voltage value $V_{pgm}$ and threshold voltage $V_{th}$ according to the first embodiment. $V_{thup}$ represents the relationship between write voltage $V_{pgm}$ and threshold voltage $V_{th}$ when the polarization of the ferroelectric layer before write is assumed to be directed upward (positive on the charge storage layer side and negative on the control gate electrode side). $V_{thdown}$ represents the relationship between write voltage $V_{pgm}$ and threshold voltage $V_{th}$ when the polarization of the ferroelectric layer before write is assumed to be directed downward (negative on the charge storage layer side and positive on the control gate electrode side).

When write voltage $V_{pgm}$ is 9 V or less, threshold voltage $V_{th}$ after write is higher when the polarization of the ferroelectric layer before write is directed upward than when the polarization of the ferroelectric layer before write is directed downward. This indicates that the upward polarization acts in a direction to raise threshold voltage $V_{th}$, and the downward polarization acts in a direction to lower threshold voltage $V_{th}$.

When write voltage $V_{pgm}$ exceeds 9 V, threshold voltage $V_{th}$ after write has a value corresponding to the write voltage $V_{pgm}$ independently of the direction (upward or downward) of the polarization of the ferroelectric layer before write.

For example, to perform write by setting the electric field in first insulating layer 2B to 10 MV/cm, the write voltage $V_{pgm}$ needs to be 20 V in a general flash memory. In the memory cell of this embodiment, however, write voltage $V_{pgm}$ of about 9 V suffices to perform write under the same condition. Hence, according to this embodiment, write can be done using a very low voltage as compared to the general flash memory.

FIG. 7 is a graph showing the relationship between the electron density in a charge storage layer and threshold voltage $V_{th}$ according to the first embodiment.

The electron density indicates the number of electrons per unit area in the charge storage layer.

$V_{thup}$ represents the relationship between the electron density [$cm^{-2}$] and threshold voltage $V_{th}$ when the polarization of the ferroelectric layer is directed upward. $V_{thdown}$ represents the relationship between the electron density [$cm^{-2}$] and threshold voltage $V_{th}$ when the polarization of the ferroelectric layer is directed downward.

When the electron density is $2\times10^{14}$ [$cm^{-2}$] or less, and threshold voltage $V_{th}$ ranges from 2 V to 4 V, threshold voltage $V_{th}$ is higher when the polarization of the ferroelectric layer is directed upward than when the polarization of the ferroelectric layer is directed downward. This indicates that the upward polarization acts in a direction to raise the threshold voltage, and the downward polarization acts in a direction to lower the threshold voltage. In a general flash memory, approximately 10 electrons are injected into a charge storage layer having a planar size of 10 [nm]×10 [nm] at best. In this embodiment, however, 200 or more electrons can be injected into a charge storage layer having a planar size of 10 [nm]×10 [nm].

Hence, the electron density in the charge storage layer of this embodiment is higher by 10 times or more than in the general flash memory.

Hence, the 1 electron sensitivity in the charge storage layer of this embodiment is lower than in the general flash memory. For this reason, a variation in threshold voltage $V_{th}$ is smaller in this embodiment than in the general flash memory, resulting in advantage for multi-level recording.

The 1 electron sensitivity indicates the degree of influence of one electron in the charge storage layer on the variation in threshold voltage $V_{th}$. The higher the electron density in the charge storage layer is, the lower the 1 electron sensitivity is.

As can be seen from FIGS. 6 and 7, threshold voltage $V_{th}$ after write (erase) changes depending on the direction of polarization in the ferroelectric layer, and threshold voltage $V_{th}$ (threshold voltage $V_{th}$ at the time of read) after write (erase) also depends on the direction of polarization in the ferroelectric layer.

Hence, controlling the direction of polarization at the time of write/erase/read can improve the write/erase/read characteristic.

Figure 8:
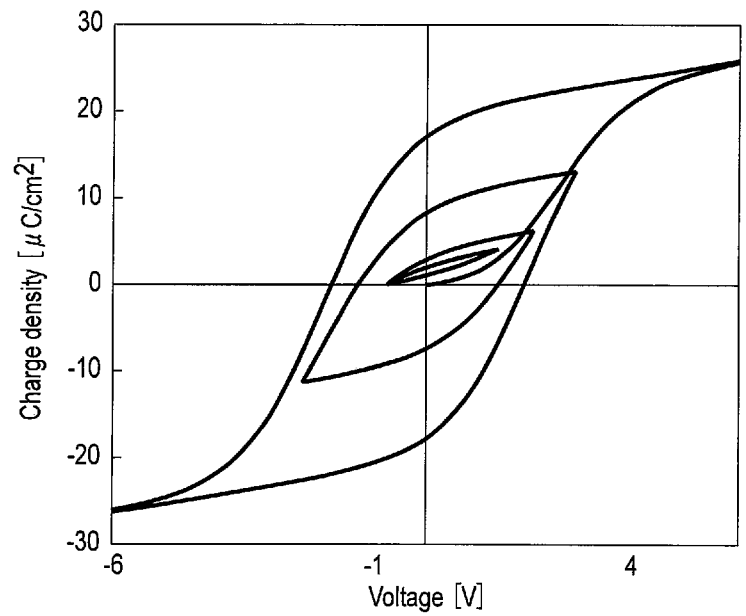
FIG. 8 is a graph showing the charge density vs. voltage characteristic of a second insulating layer according to the first embodiment.

FIG. 8 is a graph showing the charge density vs. voltage characteristic of a second insulating layer 4B according to the first embodiment.

The ordinate represents the charge density [$\mu C/cm^2$], and the abscissa represents the voltage [V].

As shown in FIG. 8, the residual polarization is 20 μC, and the coercive voltage is 2.0 V (coercive electric field is 1 MV/cm).

Figure 9:
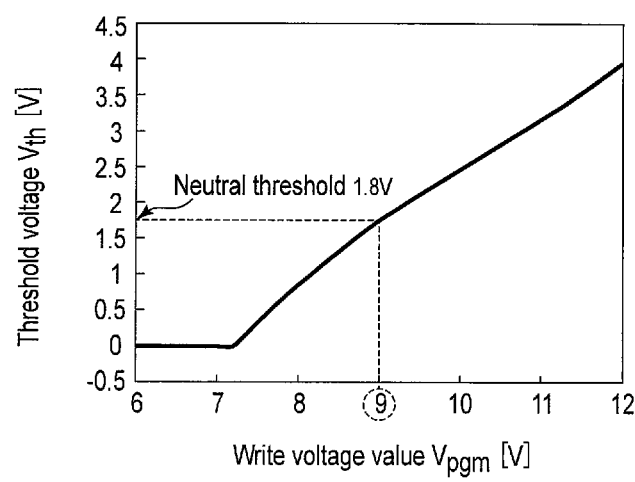
FIG. 9 is a graph showing $V_{th}$ with respect to $V_{pgm}$ according to the first embodiment.

FIG. 9 shows threshold voltage $V_{th}$ with respect to write voltage value $V_{pgm}$ according to the first embodiment.

To obtain FIG. 9, after erase voltage $V_{era}$ of 12 V was applied to the memory cell of the first embodiment to erase the data in the memory cell, write and verify were repeated.

Figure 10:
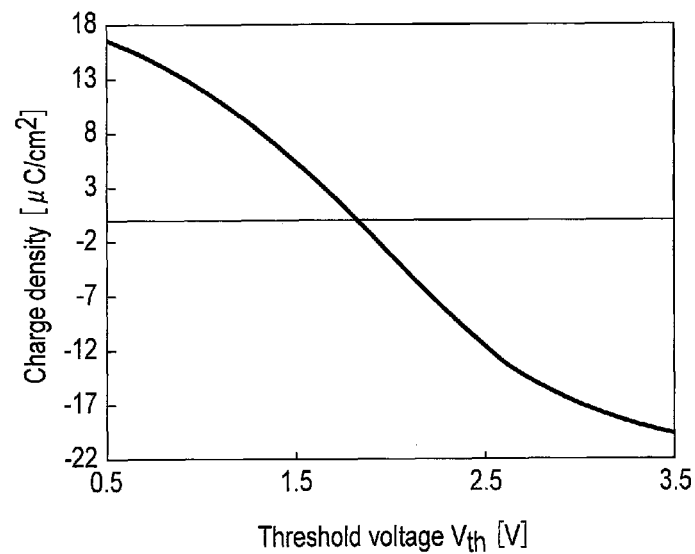
FIG. 10 is a graph showing the charge density in the charge storage layer corresponding to threshold voltage $V_{th}$ according to the first embodiment.

As shown in FIG. 9, neutral threshold voltage $V_{th}$ at which the amount of charges in charge storage layer 3B becomes 0 C is 1.8 V. Write voltage value $V_{pgm}$ at that time is 9 V. FIG. 10 is a graph showing the charge density in the charge storage layer corresponding to threshold voltage $V_{th}$ according to the first embodiment. The charge density indicates the total charge amount per unit area in the charge storage layer.

As shown in FIG. 10, when threshold voltage $V_{th}$ changes from 0 V to about 3.5 V, the charge density changes by about 35 [μC/cm$^2$] (−18 to 17 [μC/cm$^2$]).

This reveals that the memory cell of this embodiment has an excellent characteristic, considering that the change in the charge density is generally 0 to 5 [μC/cm$^2$] in a memory cell including a charge storage layer.

In addition, a stacked structure including a paraelectric capacitor (first insulating layer 2B) and a ferroelectric capacitor (second insulating layer 4B), as in the first embodiment, has a depolarization effect by a depolarizing electric field.

For example, when the total charge amount in charge storage layer 3B is zero, the paraelectric has charges (represented by Q') equal to the residual polarization of the ferroelectric. At this time, the potential of charge storage layer 3B rises by Q'/C, where C is the capacitance of the paraelectric. By this effect, a voltage is applied to the ferroelectric in a direction to cancel the polarization, and the polarization and the internal electric field gradually decrease while being left for a long time. In other words, the memory cell changes to a stable state in terms of energy in which the electrostatic energy is smaller. This phenomenon is known well in an MFIS or MFMIS type FeRAM and degrades data retention.

For example, in an MFIS type FeRAM formed by stacking a paraelectric layer made of $SiO_2$ and having a film thickness of 1 nm and a ferroelectric layer made of $HfO_2$ doped with Si (Si:HfO$_2$) and having a film thickness of 10 nm, depolarization of 20% to 30% occurs for a data retention period of one year. For this reason, the threshold changes, and data retention degrades.

In a FeRAM that retains data by the residual polarization amount, the decrease in the electric field caused by depolarization degrades data retention.

In the first embodiment, for example, when first insulating layer 2B has a film thickness of about 10 nm that is 10 times larger than in the MFIS type FeRAM, the depolarizing electric field applied to second insulating layer 4B is also larger by about 10 times. For this reason, the electric field of first insulating layer 2B decreases by about 20% to 30% for a retention period of about 30 days.

In the first embodiment, since data is retained by the charge density in charge storage layer 3B, the decrease in the electric field caused by depolarization can improve the data retention. For example, when the electric field decreases by about 30% due to depolarization in first insulating layer 2B of the first embodiment, the leakage current can be improved to about 1/10 at the time of retention.

FIG. 11 is a table, showing various characteristics when the film thicknesses and materials of the first and second insulating layers (2B and 4B) are changed, according to the first embodiment. The various characteristics are a preferable threshold voltage region, a retention charge density, write voltage value $V_{pgm}$, and an insulating layer voltage at the time of retention.

Nos. 1 to 3 in the table represent the various characteristics when the film thicknesses of the first and second insulating layers (2B and 4B) are changed in the first embodiment.

The region of preferable threshold voltage $V_{th}$ indicates a threshold voltage when performing writing such that the retention charge density falls within the range of the residual polarization. The change amount of the threshold voltage (region of preferable threshold voltage $V_{th}$) and the insulating layer voltage at the time of retention are determined by the coercive voltage of the ferroelectric layer and are proportional to the film thickness of the ferroelectric layer.

Second Embodiment

This second embodiment is a modification of the first embodiment.

The second embodiment is different from the first embodiment in the materials and film thicknesses of first and second insulating layers (2B and 4B). The remaining points are the same as in the first embodiment, and a detailed description thereof will be omitted.

In the second embodiment, first insulating layer 2B is made of $Al_2O_3$ and having a film thickness of 6 nm. Second insulating layer 4B is an SBT film having a film thickness of 50 nm. The memory cell size is 24 nm×24 nm. The voltage (oxide film voltage) of first insulating layer 2B at the time of write is 4.8 V (8 MV/cm). The dose is adjusted such that the voltage (oxide film voltage) of first insulating layer 2B becomes threshold voltage $V_{th}$ at 2.0 V.

Figure 12:
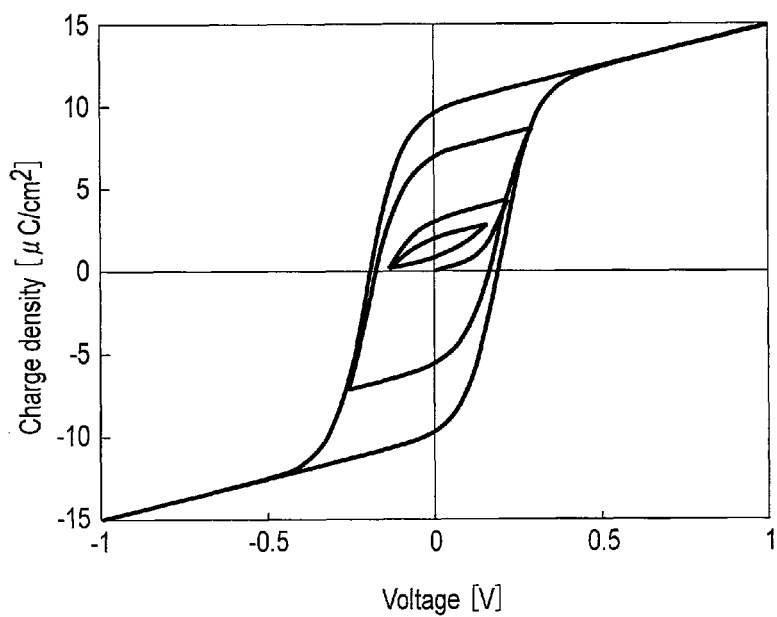
FIG. 12 is a graph showing the charge density vs. voltage characteristic of a second insulating layer according to the second embodiment.

FIG. 12 is a graph showing the charge density vs. voltage characteristic of second insulating layer in the second embodiment.

The ordinate represents the charge density [μC/cm$^2$], and the abscissa represents the voltage [V].

As is apparent from FIG. 12, the coercive voltage in the second embodiment is 0.2 V.

Although the coercive voltage in the second embodiment is lower than that (2 V) in the first embodiment, the residual polarization has the same magnitude. Hence, the dielectric constant of second insulating layer 4B (SBT) of the second embodiment is larger than that of second insulating layer 4B (Si:HfO$_2$) of the first embodiment by almost one order of magnitude.

Figure 13:
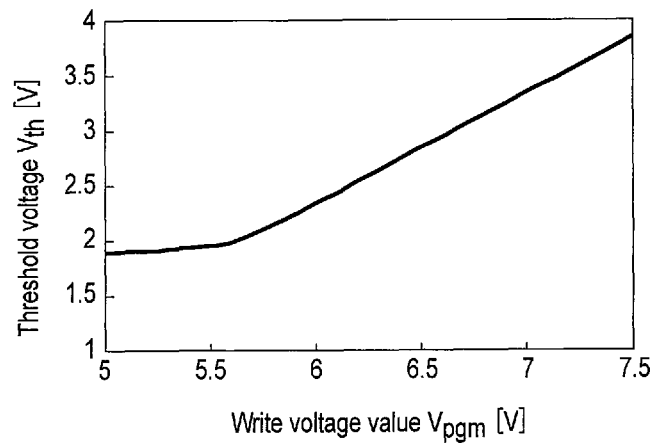
FIG. 13 is a graph showing $V_{th}$ with respect to $V_{pgm}$ according to the second embodiment.

FIG. 13 is a graph showing threshold voltage $V_{th}$ with respect to write voltage value $V_{pgm}$ in the second embodiment.

Figure 14:
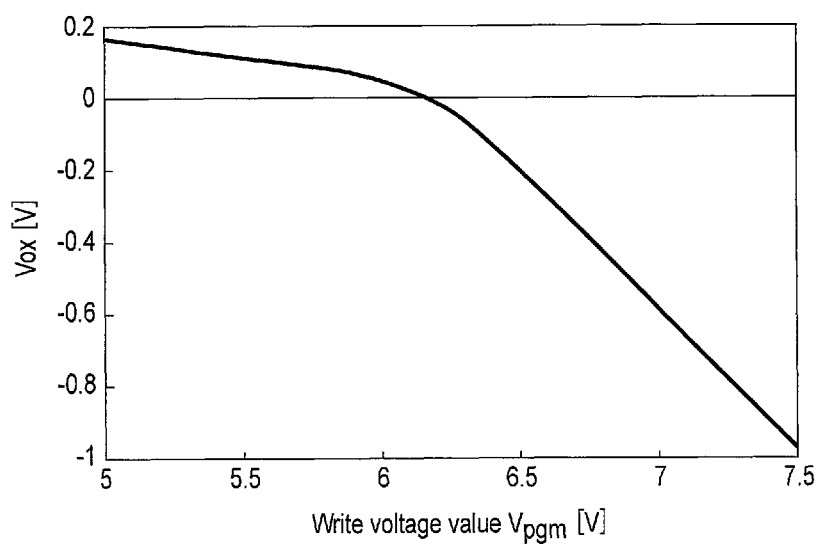
FIG. 14 is a graph showing a change in $V_{ox}$ with respect to $V_{pgm}$ according to the second embodiment.

FIG. 14 is a graph showing a change in $V_{ox}$ with respect to write voltage value $V_{pgm}$ according to the second embodiment. $V_{ox}$ is a voltage applied to first insulating layer 2B (oxide film) of the second embodiment at the time of retention (at the time of zero bias).

As shown in FIG. 13, threshold voltage $V_{th}$ rises when write voltage value $V_{pgm}$ is 5.5 V or more.

As shown in FIG. 14, when write voltage value $V_{pgm}$ is 6 V or more, voltage $V_{ox}$ of first insulating layer 2B at the time of retention starts greatly changing.

A different is generated between write voltage value $V_{pgm}$ at which threshold voltage $V_{th}$ largely changes and write voltage value $V_{pgm}$ at which $V_{ox}$ largely changes due to the nonlinearity of the dielectric constant of the ferroelectric layer. It is therefore possible to change only threshold voltage $V_{th}$ almost without changing electric field $V_{ox}$ of first insulating layer 2B at the time of retention. This can largely improve the data retention characteristic.

No. 4 in the table of FIG. 11 represents various characteristics in the second embodiment.

[Read Method]

The read method of this embodiment is associated with a nonvolatile memory cell including a charge storage layer and a control gate electrode.

As is apparent from FIG. 6, when write voltage value $V_{pgm}$ is 9 V or less, threshold voltage $V_{th}$ after write is higher when the polarization of the ferroelectric layer before write is directed upward than when the polarization of the ferroelectric layer before write is directed downward. Additionally, as is apparent from FIG. 7, when the electron density is $2\times10^{14}$ [cm$^{-2}$] or less, and threshold voltage $V_{th}$ ranges from 2 V to 4 V, threshold voltage $V_{th}$ is higher when the polarization of the ferroelectric layer is directed upward than when the polarization of the ferroelectric layer is directed downward.

This phenomenon occurs because of use of the ferroelectric layer in the second insulating layer and is caused by the hysteresis, that is, the residual polarization of the ferroelectric layer.

This phenomenon affects not write but read after write.

At the time of read after write, the threshold voltage varies due to the residual polarization of the ferroelectric layer. The variation in the residual polarization can occur due to, for example, disturbance or depolarization by a depolarizing electric field.

In other words, since the polarization state immediately after write and that after write are different, a read error occurs.

The problem that the polarization of the ferroelectric layer changes after write can be solved by applying a voltage that arranges the polarization to the ferroelectric layer. The voltage that arranges the polarization of the ferroelectric layer is defined as polarization arrangement pulse voltage $V_{PAP}$.

The read method of this embodiment will be described below in detail.

Figure 15:
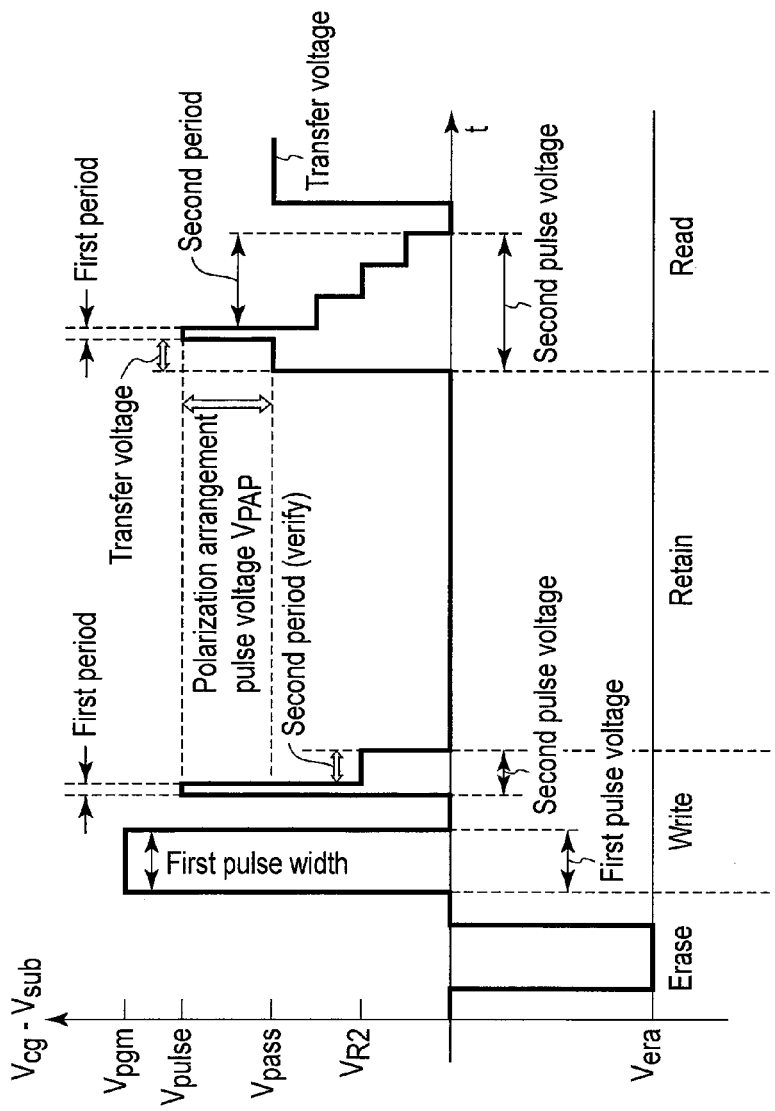
FIG. 15 is a timing chart showing time-rate changes in voltages applied to a selected memory cell according to the embodiment.

FIG. 15 is a timing chart showing time-rate changes in voltages applied to a selected memory cell according to the embodiment.

FIG. 16 is a timing chart showing the read method for selected and unselected memory cells according to the embodiment.

A selected memory cell is a memory cell selected from memory cells arranged in an array to perform write/erase/read. On the other hand, an unselected memory cell is a memory cell other than the selected memory cell.

In each of the selected and unselected memory cells, substrate voltage $V_{sub}$ is applied to the semiconductor layer, and control gate voltage $V_{cg}$ is applied to the control gate electrode.

The voltage applied between the control gate electrode and the semiconductor substrate in each of the selected and unselected memory cells is the difference $V_{cg}-V_{sub}$ between control gate voltage $V_{cg}$ and substrate voltage $V_{sub}$. Voltage ($V_{cg}-V_{sub}$) changes along with time t.

Voltage ($V_{cg}-V_{sub}$) serves as the following voltages in accordance with the operation.

In the selected memory cell, at the time of write to store charges in the charge storage layer, a first pulse voltage having first voltage value $V_{pgm}$ and a first pulse width is applied to the control gate electrode via the control circuit. At the time of read to judge the charge amount in the charge storage layer, a second pulse voltage is applied to the control gate electrode.

The second pulse voltage has a first period and a second period after the first period. The second period includes read voltage value $V_{Rn}$ to judge the charge amount in the charge storage layer. The first period includes second voltage value $V_{pulse}$ larger than the read voltage value and the polarization arrangement pulse voltage $V_{PAP}$ having a second pulse width narrower than the first pulse width. The first and second periods are continuous.

The second pulse width needs to be at least 10 nsec to reverse the polarization that has changed after write, and also needs to be 1/10 to 1/20 or less of the first pulse width to prevent a write error.

The write error is a phenomenon in which a tunnel current flows to the charge storage layer due to the operation of applying polarization arrangement pulse voltage $V_{PAP}$. In other words, the write error is a phenomenon in which charges are stored from the semiconductor layer in the charge storage layer through the first insulating layer or a phenomenon in which threshold voltage $V_{th}$ changes.

In a ferroelectric layer made of, for example, $HfO_2$ doped with Si (Si:$HfO_2$), the second pulse width is about 100 nsec.

Basically, second voltage value $V_{pulse}$ is smaller than first voltage value $V_{pgm}$. However, when the second pulse width is large than 10 nsec and 1/20 or less of the first pulse width, second voltage value $V_{pulse}$ may be larger than first voltage value $V_{pgm}$.

The memory cells can store data of $2^n$ (n is a natural number of 2 or more) values. For this reason, there exist ($2^n-1$) different read voltage values $V_{Rh}$.

However, the read to judge the charge amount in the charge storage layer includes verify read to verify the charges stored in the charge storage layer at the time of write. For example, as shown in FIG. 15, the read voltage value of verify read for second data is $V_{R2}$ for n=2.

Performing the same operation for verify read and read of another type can make the threshold of verity read and that of read of another type equal to each other.

As described above, at the time of read, the control circuit applies the second pulse voltage to the control gate electrode of the selected memory cell to judge the charge amount in the charge storage layer.

In the unselected memory cell, a third pulse voltage is applied to the control gate electrode via the control circuit. The third pulse voltage has the first period and a third period after the first period. The third period includes transfer voltage value $V_{pass}$ larger than read voltage value $V_{Rn}$. Transfer voltage value $V_{pass}$ is smaller than second voltage value $V_{pulse}$.

As described above, at the time of read, the control circuit applies the third pulse voltage to the control gate electrode of the unselected memory cell not to judge the charge amount in the charge storage layer.

The first period in the second and third pulse voltages may have transfer voltage value $V_{pass}$ before polarization arrangement pulse voltage $V_{PAP}$.

In a NAND flash memory in which NAND strings each including memory cells connected in series are arranged in an array, the second pulse voltage can be applied at once to NAND strings to perform read.

The NAND string and the NAND flash memory will be described later in an application example.

FIG. 17 is a conceptual view showing the effect of polarization arrangement pulse voltage $V_{PAP}$ according to the embodiment, in which e⁻ indicates an electron, and h⁺ indicates a hole.

As shown in FIG. 17, the polarization of the second insulating layer is uniformly directed immediately after write. However, before read, the direction of the polarization of the second insulating layer is disordered. This is caused by, for example, disturbance or depolarization by a depolarizing electric field after write. The disordered polarization directions are uniformly arranged before read by applying polarization arrangement pulse voltage $V_{PAP}$ to the control gate electrode of the memory cell.

As described above, after write, polarization arrangement pulse voltage $V_{PAP}$ is applied to the control gate electrode before read, thereby arranging the disordered polarization directions to the same direction as that immediately after write.

Figure 18:
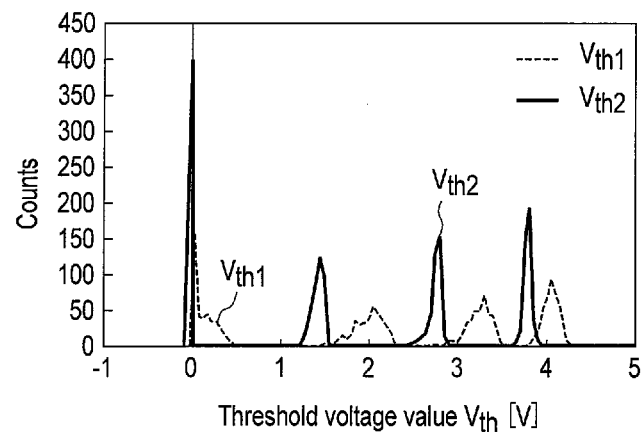
FIG. 18 is a graph showing the effect of polarization arrangement pulse voltage $V_{PAP}$ by the distribution of threshold voltages $V_{th}$ according to the embodiment.

FIG. 18 is a graph showing the effect of polarization arrangement pulse voltage $V_{PAP}$ by distribution of threshold voltages $V_{th}$ according to the embodiment.

Quaternary data were written in 1,600 memory cells of the first embodiment.

Quaternary write voltage values are 7 V, 8.5 V, 10 V, and 11.5 V.

After the write, read was performed for an ensemble to which white Gaussian noise of a variance of 3 V was applied.

The broken line indicates threshold voltage $V_{th1}$ measured by a general read method of applying noise and then directly reading threshold voltage $V_{th1}$. The solid line indicates threshold voltage $V_{th2}$ measured by the read method of this embodiment.

In the read method of this embodiment, before application of polarization arrangement pulse voltage $V_{PAP}$, transfer voltage value $V_{pass}$ of 4.5 V is applied, and second voltage value $V_{pulse}$ of 7 V is then applied in the first period. The second pulse width in the first period is 100 nsec. After the second voltage value having the second pulse width is applied, the voltage is temporarily lowered up to the transfer voltage value. The voltage value is then gradually lowered, and threshold voltage $V_{th2}$ is read.

In the general read method, since noise is applied, the distribution of threshold voltage $V_{th1}$ is deteriorated. On the other hand, in the read method of this embodiment, since polarization arrangement pulse voltage $V_{PAP}$ is provided, the distribution of threshold voltage $V_{th2}$ is improved.

As described above, according to the read method of this embodiment, applying polarization arrangement pulse voltage $V_{PAP}$ before read can return the polarization that has changed after write to the polarization at the time of write.

Application Examples

The application example is associated with a nonvolatile memory cell including a charge storage layer and a control gate electrode.

Application of a NAND string structure formed by memory cells according to the above-described embodiment to a NAND flash memory will be described.

The NAND string structure applied to the NAND flash memory is advantageous in integrating memory cells.

FIG. 19 is a block diagram showing a NAND flash memory as an application example of the each embodiment.

As shown in FIG. 19, NAND flash memory 20 includes memory cell array 11, bit line control circuit 12, column decoder 13, data buffer 14, data input/output terminal 15, word line control circuit 16, control circuit 17, control signal input terminal 18, and voltage generation circuit 19. Memory cell array 11 includes blocks. Each block includes memory cells, word lines, bit lines, and the like. Each block includes pages each including memory cells. Details will be described later. Memory cell array 11 is electrically connected to bit line control circuit 12, word line control circuit 16, control circuit 17, and voltage generation circuit 19.

Bit line control circuit 12 reads data of a cell unit in memory cell array 11 through a bit line and detects the state of the memory cell through the bit line. Bit line control circuit 12 also writes (programs) data in a memory cell by applying a write (program) voltage to the memory cell in memory cell array 11 through a bit line. Column decoder 13, data buffer 14, and control circuit 17 are electrically connected to bit line control circuit 12.

Bit line control circuit 12 includes a sense amplifier, a data storage circuit, and the like (not shown). Column decoder 13 selects a specific data storage circuit. Data of a memory cell read to the selected data storage circuit is externally output out of the memory from data input/output terminal 15 via data buffer 14. Data input/output terminal 15 is connected to a device (for example, a host, a memory controller, or the like) outside the memory. Data input/output terminal 15 receives various kinds of commands COM to control the operation of NAND flash memory 20 or addresses ADD from the host or memory controller HM, receives data DT, or outputs data DT to the host or memory controller HM. Write data DT input to data input/output terminal 15 is supplied via data buffer 14 to the data storage circuit selected by column decoder 13. Command COM and address ADD are supplied to control circuit 17. The sense amplifier amplifies the potential on a bit line.

Word line control circuit 16 selects a specific word line in memory cell array 11 under the control of control circuit 17. Word line control circuit 16 receives a voltage necessary for read, write, or erase from voltage generation circuit 19. Word line control circuit 16 applies the voltage to the selected word line.

Control circuit 17 is electrically connected to memory cell array 11, bit line control circuit 12, column decoder 13, data buffer 14, word line control circuit 16, and voltage generation circuit 19 and controls them. Control circuit 17 is connected to control signal input terminal 18 and controlled by a control signal such as an ALE (Address Latch Enable) signal input from outside via control signal input terminal 18. Control circuit 17 also outputs a control signal to voltage generation circuit 19 and controls it.

Voltage generation circuit 19 applies a necessary voltage to memory cell array 11, word line control circuit 16, and the like in each operation such as write, read, or erase under the control of control circuit 17. Voltage generation circuit 19 is configured to be able to generate such various kinds of voltages. More specifically, voltage generation circuit 19 generates, for example, voltage VREAD at the time of data read, voltages VPGM, VPASS, and VISO at the time of data write, and voltage VERA at the time of data erase.

Figure 20:
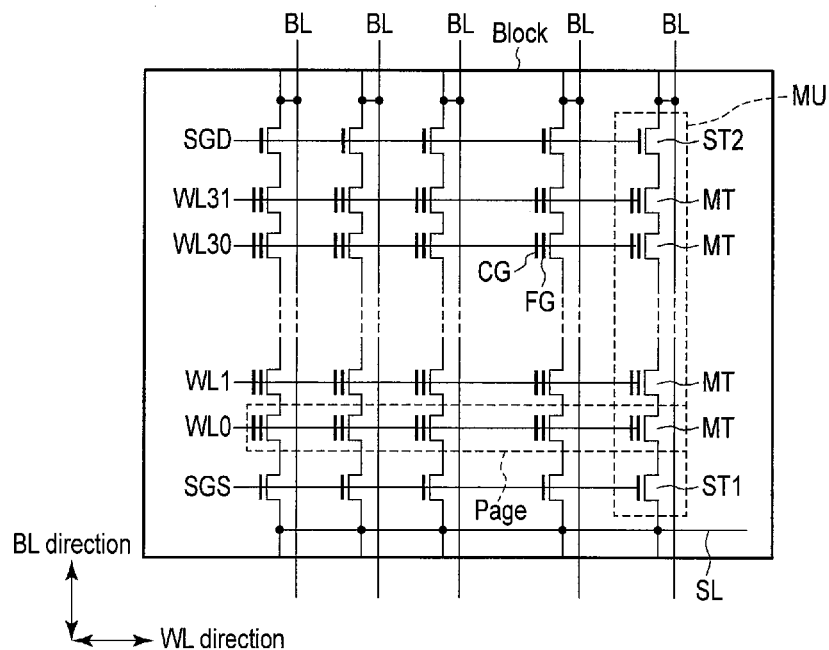
FIG. 20 is a circuit diagram showing an example of a block of the NAND flash memory as an application example of the each embodiment.

FIGS. 20 and 21 are a circuit diagram showing an example of a block of the NAND flash memory and a sectional view of the NAND string, respectively as an application example of the each embodiment. FIG. 20 illustrates only one block. As shown in FIGS. 20 and 21, a block (Block) includes memory cell strings (memory cell units) MU arranged along the word line direction (WL_direction, WL direction). Memory cell strings MU run in the bit line direction (BL_direction, BL_direction). Each memory cell string MU is formed from a NAND string and select transistors "ST1 and ST2". The NAND string is formed from (for example, 32) memory cell transistors MT whose current paths (sources/drains SD) are connected in series with each other. Select transistors "ST1 and ST2" are connected to the two ends of the NAND string, respectively. The other end of the current path of select transistor "ST2" is connected to bit line BL, and the other end of the current path of select transistor "ST1" is connected to source line SL.

Each of word lines WL0 to WL31 runs in the WL direction and is connected to memory cell transistors MT belonging to the same row. Select gate line SGD runs along the WL direction and is connected to all select transistors "ST2" in the block. Select gate line SGS runs along the WL direction and is connected to all select transistors "ST1" in the block.

A group of memory cell transistors MT connected to the same word line WL forms a page. Data is read or written on the page basis. In a multi-level memory cell capable of retaining data of bits in one memory cell, pages are assigned to one word line. Note that data erase is done on the block basis.

Memory cell transistor MT is provided at each intersection between bit lines BL and word lines WL. Memory cell transistor MT is provided on a well formed in a semiconductor substrate. Memory cell transistor MT includes a first insulating layer (not shown) made of a paraelectric stacked on the well, charge storage layer FG (for example, an insulating film including a floating gate electrode and a trap or a stacked film), a second insulating layer (not shown) that is a ferroelectric layer, control electrode (control gate electrode) CG (word line WL), and source/drain regions SD. Source/drain "regions SD" corresponding to the current path of memory cell transistor MT are connected in series with source/drain "regions SD" of adjacent memory cell transistor MT. Each of select transistors "ST1 and ST2" includes a gate insulating film (not shown) stacked on the semiconductor substrate, gate electrodes SGS and SGD, and source/drain regions SD.

As described above, the memory using the memory cell according to this embodiment has a high coupling ratio, decreases the leakage current generated from the second insulating layer at the time of write, and operates using a low write/erase voltage. In addition, since the electron density in the charge storage layer is high, the 1 electron sensitivity is low, and the variation in the threshold voltage distribution is small. For this reason, the memory cell is suitable for microfabrication. Furthermore, it is easy to control the electric field of the first insulating layer at the time of write due to the nonlinearity of the dielectric constant. During the retention period, the polarization stabilizes due to the depolarization effect of the ferroelectric layer so that the electric fields in the first insulating layer (paraelectric film) and the second insulating layer (ferroelectric layer) are minimized. This phenomenon improves the charge retention characteristic of the charge storage layer.

[Manufacturing Method]

A manufacturing method when the embodiment is applied to a NAND flash memory will be described below.

In this embodiment, as shown in FIG. 22, the surface of semiconductor layer 21 is, for example, thermally oxidized to form first insulating layer 22. First insulating layer 22 uses, as a material other than the thermal oxide film, for example, a nitride film of silicon nitride (SiN), silicon oxynitride (SiON), or the like, a metal oxide film of alumina ($AlO_x$), hafnium oxide ($HfO_2$), tantalum oxide ($Ta_2O_5$), zirconium oxide ($ZrO_2$), or the like, or a stacked film thereof. When first insulating layer 22 is a thermal oxide film, its film thickness is, for example, about 5 nm to 10 nm. The film thickness of first insulating layer 22 is designed to an appropriate value based on the leakage current and the dielectric constant. When first insulating layer 22 is a high-K dielectric film, its film thickness can be larger than 5 nm to 10 nm.

Next, conductive film 23 is formed on first insulating layer 22 as a charge storage layer using, for example, CVD. Conductive film 23 uses, for example, polysilicon or a metal such as TiN.

As shown in FIG. 23, ferroelectric layer 24 is formed as a second insulating layer using, for example, CVD. The material of ferroelectric layer 24 serving as the second insulating layer is assumed to be, for example, an Hf-based ferroelectric layer using $HfO_2$ doped with Si, $HfO_2$ doped with Y, or the like, SBT, PZT, BLT, BST, or the like is possible.

The Hf-based ferroelectric layer is suitable for thinning because the leakage current is small, and the coercive electric field is large as compared to SBT or PZT. However, a TiN layer for suppressing distortion is needed on at least one of the upper and lower sides. The film thickness of ferroelectric layer 24 made of the Hf-based material is, for example, about 10 nm to 20 nm. Note that this step may be performed after STI formation to be described later.

As shown in FIG. 24, etching is performed in a stripe pattern along the BL direction by RIE or the like.

As shown in FIG. 25, insulating layer 25 is buried and planarized by, for example, CMP to form STI. At this time, air gaps may be formed using a material having poor burying properties for insulating layer 25.

As shown in FIG. 26, conductive layer 26 is formed as a control gate electrode. When an Hf-based ferroelectric layer is used as second insulating layer 24, conductive layer 26 needs to be made of TiN to apply distortion. However, when TiN is used for the charge storage layer, conductive layer 26 need not use TiN. When second insulating layer 24 is made of SBT, PZT, or the like and can therefore serve as a ferroelectric layer without applying distortion, a conductive oxide such as $IrO_2$ or $RuO_2$ is preferably used to prevent the reducing process of the ferroelectric layer. As described above, a material according to the ferroelectric layer needs to be selected for conductive layer 26. However, a metal layer having conductivity higher than that of conductive layer 26 may be stacked on conductive layer 26 for the purpose of reducing the resistance.

As shown in FIG. 27, when forming second insulating layer 24 after STI formation, second insulating layer 24 is formed immediately before conductive layer 26 is formed. Note that when an Hf-based ferroelectric layer is used, second insulating layer 24 can be made relatively thin. For this reason, this structure can also electrically separate the memory cells.

As shown in FIG. 28, the structure shown in FIGS. 26 and 27 is etched in a stripe pattern along the WL direction. The etching is done by, for example, RIE.

Next, insulating layer 27 is buried.

With the steps shown in FIGS. 22, 23, 24, 25, 26, 27, and 28, the NAND flash memory to which the embodiment is applied is completed.

CONCLUSION

According to this embodiment, it is possible to obtain a memory cell that has a high coupling ratio, reduces the leakage current generated from the second insulating layer at the time of write, and operates using a low write/erase voltage. Since the electron density in the charge storage layer is high, the 1 electron sensitivity is low, and the variation in the threshold voltage distribution is small. Hence, the memory cell is suitable for microfabrication. In addition, it is easy to control the electric field of the first insulating layer at the time of write because of the nonlinearity of the dielectric constant. Furthermore, during the retention period, the polarization stabilizes due to the depolarization effect of the ferroelectric layer so that the electric fields in the first insulating layer (paraelectric film) and the second insulating layer (ferroelectric layer) are minimized. This phenomenon improves the charge retention characteristic of the charge storage layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:

memory cells each of which stores data with two or more levels, each of the memory cells including a semiconductor layer, a first insulating layer on the semiconductor layer, a charge storage layer on the first insulating layer, a second insulating layer on the charge storage layer, and a control gate electrode on the second insulating layer, and the second insulating layer including a ferroelectric layer; and a control circuit which is configured to:

apply a first pulse voltage having a first voltage value and a first pulse width to the control gate electrode in a write mode in which charges are stored in the charge storage layer, and apply a second pulse voltage to the control gate electrode in a read mode in which a charge amount in the charge storage layer is judged, wherein the second pulse voltage has a first period and a second period after the first period, wherein the second period has a read voltage value to judge the charge amount in the charge storage layer, and wherein the first period has a second voltage value larger than the read voltage value and a polarization arrangement pulse voltage having a second pulse width narrower than the first pulse width.

2. The device of claim 1, wherein the second voltage value is smaller than the first voltage value.

3. The device of claim 1, wherein the second pulse width is larger than 10 nsec and not more than 1/20 of the first pulse width, and the second voltage value is larger than the first voltage value.

4. The device of claim 3, wherein the ferroelectric layer includes $HfO_2$ doped with Si, and the second pulse width is less than 100 nsec.

5. The device of claim 4, wherein the second insulating layer comprises a TiN layer arranged on at least one of an upper surface and a lower surface of the ferroelectric layer.

6. The device of claim 1, wherein the first period and the second period are continuous.

7. The device of claim 1, wherein each of the memory cells stores data with $2^n$ (n is a natural number not less than 2) levels.

8. The device of claim 7, wherein the read voltage value includes ($2^{n-1}$) different read voltage values.

9. The device of claim 1, further comprising a NAND string in which the memory cells are connected in series.

10. The device of claim 9, wherein the control circuit applies the second pulse voltage to the control gate electrode of a selected memory cell among the memory cells in the read mode.

11. The device of claim 10, wherein the control circuit applies a third pulse voltage to the control gate electrode of an unselected memory cell among the memory cells.

12. The device of claim 11, wherein the third pulse voltage has the first period and a third period after the first period, and the third period has a transfer voltage value larger than the read voltage value.

13. The device of claim 12, wherein the transfer voltage value is smaller than the second voltage value.

14. The device of claim 13, wherein the first period has the transfer voltage value before the polarization arrangement pulse voltage.

15. The device of claim 1, wherein the read mode includes a verify read mode in which the charges stored in the charge storage layer in the write mode are verified.

16. The device of claim 1, wherein the ferroelectric layer includes $HfO_2$ doped with Y.

17. The device of claim 16, wherein the second insulating layer comprises a TiN layer arranged on at least one of an upper surface and a lower surface of the ferroelectric layer.

18. The device of claim 1, wherein the ferroelectric layer includes one material selected from a group of SBT, PZT, BLT, and BST.

19. The device of claim 18, wherein the second insulating layer comprises a conductive oxide layer arranged on at least one of an upper surface and a lower surface of the ferroelectric layer.

* * * * *